United States Patent [19]

Danger

[11] Patent Number: 5,719,515
[45] Date of Patent: *Feb. 17, 1998

[54] DIGITAL DELAY LINE

[75] Inventor: Jean-Luc Danger, Paris, France

[73] Assignee: SGS-Thomson Microelectronics S.A., Saint Genis, France

[*] Notice: The term of this patent shall not extend beyond the expiration date of Pat. No. 5,633,608.

[21] Appl. No.: 641,003

[22] Filed: Apr. 29, 1996

Related U.S. Application Data

[63] Continuation of Ser. No. 306,488, Sep. 15, 1994, Pat. No. 5,633,608.

[30] Foreign Application Priority Data

Sep. 27, 1993 [FR] France ................. 93 11750

[51] Int. Cl.$^6$ .................. H03K 5/13; H03K 5/159
[52] U.S. Cl. .................. 327/270; 327/276; 327/152; 327/158; 327/161; 327/244
[58] Field of Search .................. 327/276, 277, 327/270, 269, 263, 265, 233, 231, 234, 235, 236, 243, 244, 245, 250, 251, 149, 152, 151, 153, 158, 160, 161, 407, 278, 257, 258

[56] References Cited

U.S. PATENT DOCUMENTS

| | | | |
|---|---|---|---|
| 4,646,297 | 2/1987 | Palmquist et al. | 327/250 |
| 4,677,499 | 6/1987 | Shirota et al. | 358/339 |
| 4,737,670 | 4/1988 | Chan | 307/602 |
| 4,755,704 | 7/1988 | Flora et al. | 327/153 |
| 4,780,681 | 10/1988 | Dahlman | 327/250 |
| 4,845,390 | 7/1989 | Chan | 307/602 |
| 5,043,596 | 8/1991 | Masuda et al. | 327/250 |
| 5,087,829 | 2/1992 | Ishibashi et al. | 327/152 |
| 5,103,185 | 4/1992 | Arai | 327/153 |
| 5,118,975 | 6/1992 | Hillis et al. | 327/158 |
| 5,122,761 | 6/1992 | Wischermann | 327/158 |
| 5,146,121 | 9/1992 | Searles et al. | 327/244 |
| 5,162,746 | 11/1992 | Ghoshal | 327/244 |
| 5,191,295 | 3/1993 | Necoechea | 327/158 |
| 5,210,450 | 5/1993 | Parkinson | 327/152 |
| 5,250,913 | 10/1993 | Gleichert et al. | 331/25 |
| 5,252,867 | 10/1993 | Sorrells et al. | 307/606 |
| 5,258,660 | 11/1993 | Nelson et al. | 327/269 |
| 5,260,608 | 11/1993 | Marbot | 327/263 |
| 5,272,729 | 12/1993 | Bechade et al. | 327/231 |
| 5,281,874 | 1/1994 | Sorrells et al. | 307/606 |
| 5,365,130 | 11/1994 | Murray et al. | 327/278 |
| 5,389,830 | 2/1995 | Buckingham et al. | 327/258 |
| 5,471,165 | 11/1995 | Liedberg | 327/250 |
| 5,521,499 | 5/1996 | Goldenberg et al. | 327/244 |
| 5,552,733 | 9/1996 | Lesmeister | 327/269 |

FOREIGN PATENT DOCUMENTS 56-157129  12/1981  Japan ................. 327/407

*Primary Examiner*—Timothy P. Callahan
*Assistant Examiner*—Eunja Shin
*Attorney, Agent, or Firm*—Wolf, Greenfield & Sacks, PC; James H. Morris

[57] ABSTRACT

A digital delay line supplies from a periodic input signal n signals with the same period mutually shifted by one n-th of the input signal period. The digital delay line includes n cells, each of which includes m delay elements in series, each output of a delay element being connected to an input of a multiplexer. The output phase of the n-th cell is compared with that of the input signal phase. The output of a multiplexer of the n cells is modified after each comparison.

21 Claims, 4 Drawing Sheets

5,719,515

DIGITAL DELAY LINE

This application is a continuation of application Ser. No. 08/306,488, filed Sep. 15, 1994, now U.S. Pat. No. 5,633,608.

BACKGROUND OF THE INVENTION

1. Field of the Invention

The present invention relates to a digital delay line usable in particular in a voltage controlled oscillator (VCO) of a phase-locked loop (PLL) system.

2. Discussion of the Related Art

FIG. 7 is a diagram of a conventional embodiment of a digital VCO. The oscillator is controlled by a clock signal with frequency fx provided by a crystal, for example with a frequency of 270 MHz. The clock signal is provided to the clock input of a register 1. Registers or memories 2 and 3 store programmable respective values Q and P which are adjusted by the control signals of the VCO. The content of register 2 is transferred through an adder 4 to the D input of register 1 at the clock rate. The output Q of register 1 is provided to a first input of a digital comparator 5 and to a second input of the adder 4. The second input of comparator 5 receives the output P of register 3, and the comparator output provides the desired signal CLK and is applied as a reset input to register 1. Register 1 and adder 4 form an accumulator which is incremented by value Q at each clock pulse fx. So, when the multiplication of number Q has reached the value P, the comparator provides one signal pulse CLK. Therefore, this signal has a frequency $F_{CLK}=(Q/P)fx$. Of course, this involves that P is higher than Q and even higher than 2Q. However, in fact, this circuit does not provide the frequency fx multiplied by Q/P but by the closest integer value higher than Q/P. In other words, there is a jitter of the same order of magnitude as the period of frequency fx.

To increase the oscillator accuracy and decrease the jitter, the frequency fx should be increased or the frequency $F_{CLK}$ should be smoothed at the oscillator output. In both cases, this involves the addition of an analog PLL to multiply the crystal frequency or to filter the oscillator's jitter. The use of such an analog loop is in contradiction with the realization of a fully digital VCO.

To solve this problem, it has already been proposed in the prior art (refer, for example, to IEEE Journal of Solid-State Circuits, Vol. 25, No. 6, December 1990, pp. 1385–1394) to provide, as indicated in FIG. 2, from signals at frequency fx of a crystal, a plurality of signals phase-shifted by one n-th of the corresponding period, to provide respective signals of phase 1, of phase 2 ... and of phase n. Then, as represented in FIG. 3, if the phase-signal is used to provide one period of signal CLK, phase-i+1 signal (or another signal) can be used to generate the next period. In this case, the accuracy or jitter corresponds to the input signal period divided by the number of phases.

As represented in FIG. 4, the n phases can be introduced, for example, on n inputs of a multiplexer 10 used to generate the signal CLK. Multiplexer 10 is scanned at a variable frequency Fs to provide the frequency shift. Frequency Fs is directly proportional to the correction factor incoming from a filter stage normally integrated in a PLL. A bit rate multiplier 11, BRM, is designed to transfer the correction word in a scanning signal. The output of multiplier 11 is provided to an up-down counter (UDC) 12, whose up-counting or down-counting operation is determined by the most significant bit (MSB) which is the sign bit of the correction value of the filter.

In such a system, one problem lies in the realization of n signals accurately phase-shifted from signal fx. Up to now, and as indicated in the above mentioned article, these n shifted signals can be provided by a ring counter. However, the frequency of this ring counter has to be controlled to be independent of the manufacturing process, of temperature and of variations in the voltage parameters. Again, this control step involves the use of analog techniques.

SUMMARY OF THE INVENTION

Thus, an object of the present invention is to provide an implementation using only digital technologies to obtain n shifted signals from an input signal. In other words, the present invention aims to realize a programmable digital delay line allowing the provision of n signals delayed by 1/n times the period with respect to an input signal having a predetermined period.

To achieve this object, the present invention provides a digital delay line to supply from a periodic input signal n signals with the same period mutually phase-shifted by one n-th of the input signal period, including n cells, each of which includes m serial delay elements, each output of a delay element being connected to a multiplexer input; means for comparing the output phase of the n-th cell with the input signal phase; and means for modifying the multiplexer output further to each comparison.

According to an embodiment of the invention, each multiplexer is formed by m-1 two-input multiplexers, the multiplexer with the highest rank receiving the outputs of the last two delay elements, and the multiplexers of lower rank receiving the output of the multiplexer having the immediately former rank and the output of a delay element having a rank lower than the delay element processed by the multiplexer of higher rank.

According to an embodiment of the invention, each delay element includes an NAND gate having an input that receives the signal to be delayed and the other input that receives an enabling signal.

According to an embodiment of the invention, the enabling signal is used as a test signal.

According to an embodiment of the invention, the enabling signal is used as an inhibition signal for the cell delay elements that are not used.

The foregoing and other objects, features, aspects and advantages of the invention will become apparent from the following detailed description of the present invention when taken in conjunction with the accompanying drawings.

DETAILED DESCRIPTION

Figure 1:
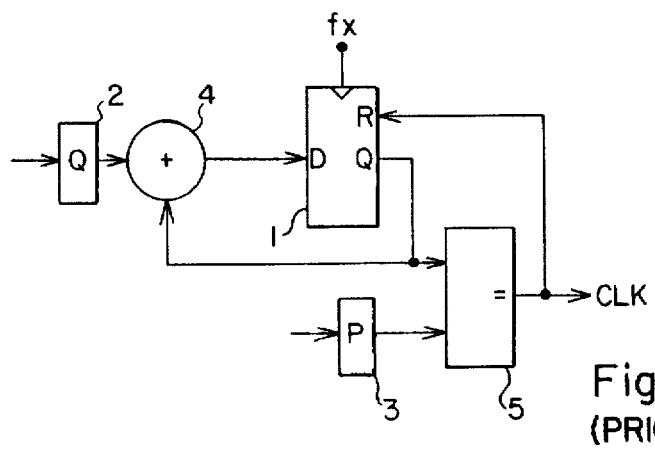
FIGS. 1–4, above described, illustrate the state of the art and the problem that is encountered.
Figure 2:
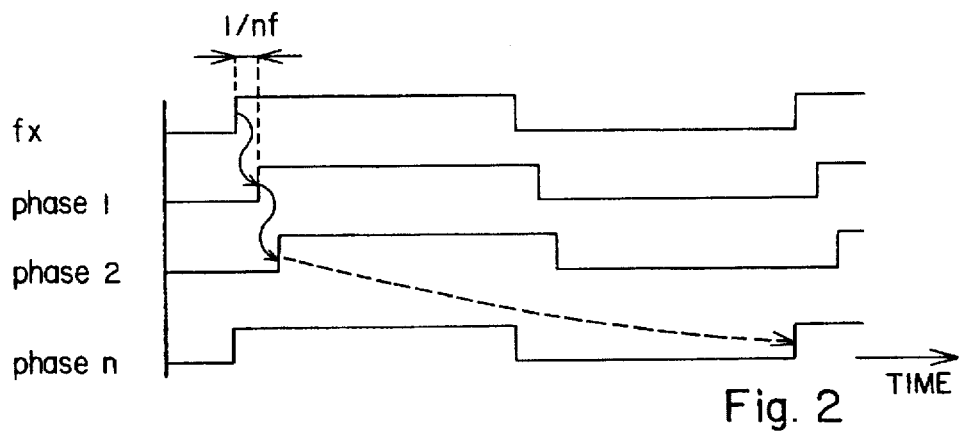
Figure 3:
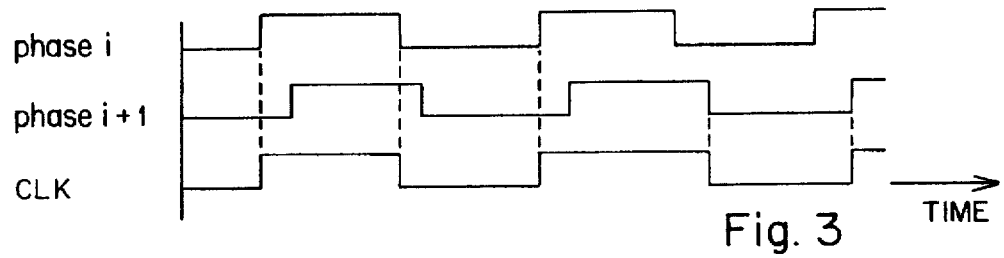
Figure 4:
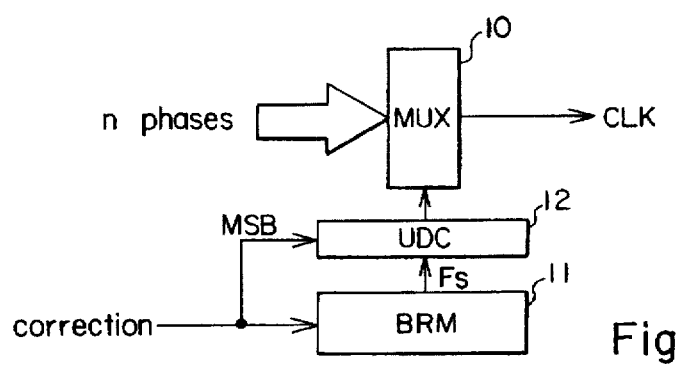
Figure 5:
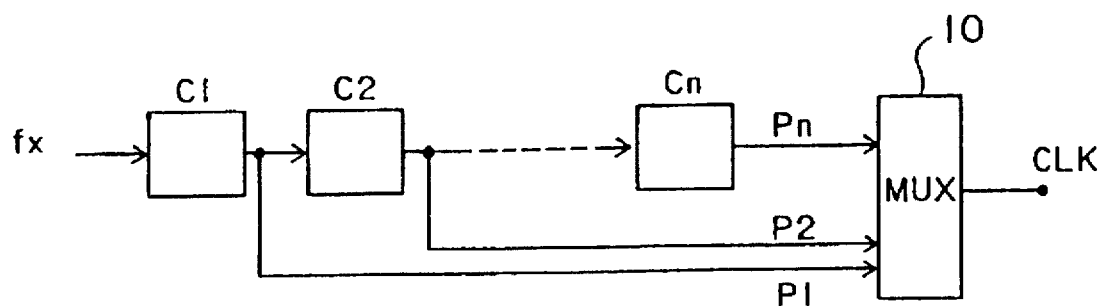
FIG. 5 represents a digital delay line according to the present invention.

As represented in FIG. 5, the present invention provides the use of a digital delay line including n cells C1, C2 ... Ci ... Cn each providing a signal delayed with respect to an input signal fx, that is, signals P1, P2 ... Pi ... Pn, to the inputs of a multiplexer 10.

It should be noted that this delay line forms an open loop and not a ring looped circuit.

Figure 6:
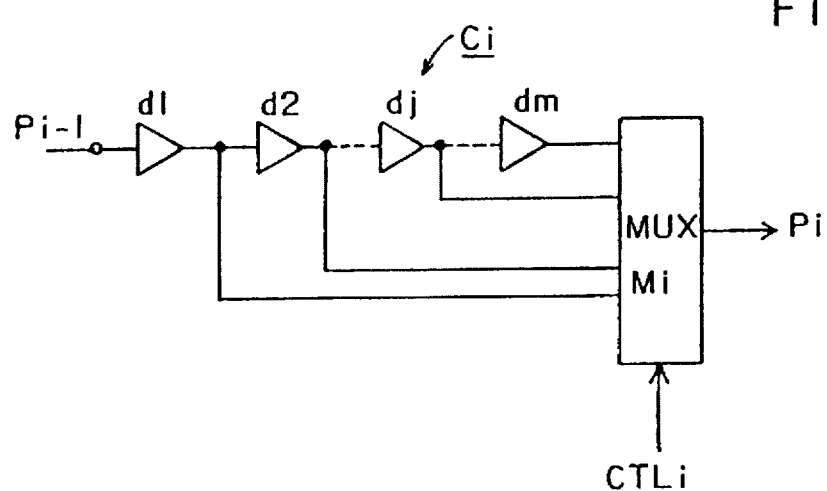
FIG. 6 represents a cell of a digital delay line according to the present invention.

FIG. 6 represents an embodiment of a cell Ci of the delay line of FIG. 5. Cell Ci includes m delay elements d1, d2 ... dj ... dm. The first delay element d1 receives the output Pi-1 of the preceding cell and the output of each of the delay elements dj is provided to the input of a multiplexer Mi, whose output corresponds to signal Pi and is provided to the next cell input (and to multiplexer 10).

In this embodiment, each delay element dj exhibits the same delay time d. Thus, by selecting through multiplexer Mi the output signal of one of the delay elements d1-dm, the delay between signals Pi-1 and Pi is equal to $j*d$ and may vary between d and $m*d$.

Each multiplexer Mi receives a control signal CTLi provided in the way described hereinafter.

Multiplexers Mi are connected to a pointer which addresses each of those multiplexers sequentially, in the order from the first to the last one or, as it will be seen hereinafter, in any other selected order, but that all the multiplexers are pointed at before a multiplexer is pointed at a second time. Each time a determined multiplexer is pointed at, the order number of its input is incremented or decremented as a function of the result of a comparison between the output Pn of the n-th cell and signal fx.

Once the delay line according to the present invention is preadjusted close to the selected adjustment, its adjustment is unlikely to vary, except in response to variations in temperature or in the frequency fx.

Figure 7:
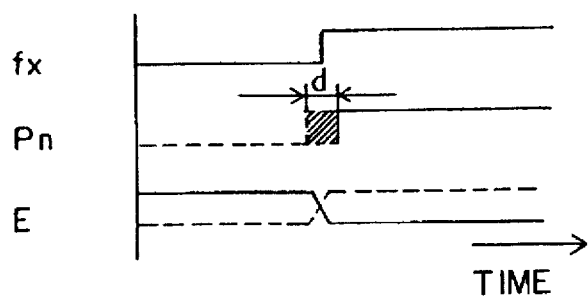
FIG. 7 is a timing diagram illustrating some characteristics of the digital delay line according to the invention.

So, as represented in FIG. 7, when the system is substantially locked on its normal operating point, the difference between the rising edges of signal fx and signal Pn is at most equal to a value ±d. Therefore, a positive (1) or negative (0) error E is detected.

At each detection of an error E, one of the multiplexers is incremented or decremented. During the next detection, the error is normally reversed and the pointed multiplexer should conversely be incremented or decremented.

Of course, as indicated above, pointing is realized so that, at a determined time, a difference higher than d never occurs between the delays provided by two distinct cells. Thus, a system with a permanent adjustment is obtained. It should be noted that the rate of the comparisons between fx and Pn is not necessarily very high and can be of several clock periods since the synchronization parameters slowly vary over the time during a normal operation of the system.

During the initialization phase of the operation of the delay line according to the invention, each cell C1-Cn is automatically set at its minimum delay and, from this moment, the delay of each cell is incremented until an error varying between one incrementation and one decrementation is found. Then, the steady state operation described with relation to FIG. 7 is obtained.

Figure 8:
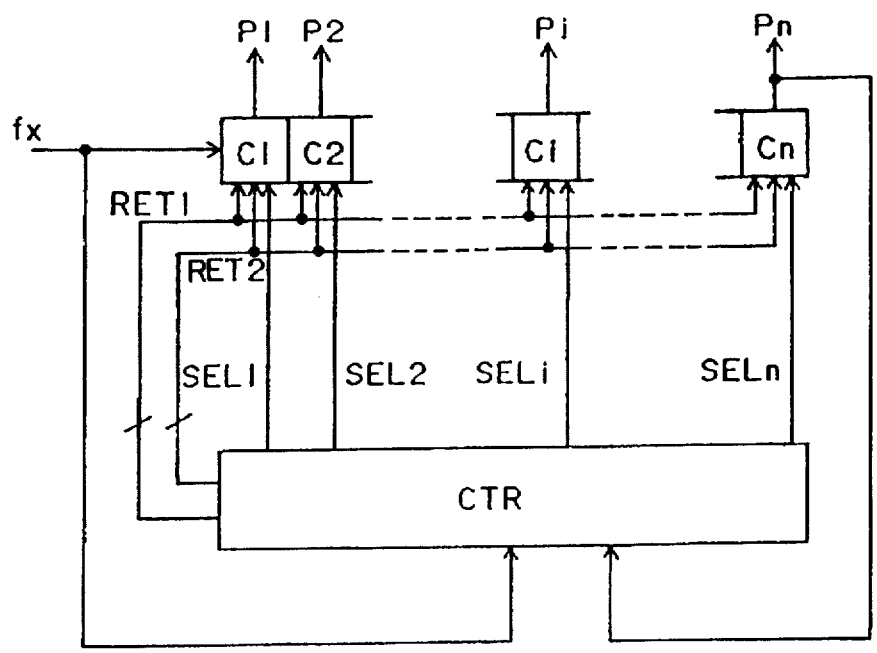
FIG. 8 represents a circuit for controlling a digital delay line according to the invention.

FIG. 8 shows an embodiment of the control circuit of the plurality of delay cells C1-Cn according to the invention. Each cell provides a respective signal P1, P2 ... Pn to the multiplexer 10. A control circuit CTR is designed to control each cell and more precisely to control decoders associated with each multiplexer Mi of those cells. As indicated above, the control circuit CTR receives the input signal fx and the output signal Pn and determines whether the delay of a cell at a given time has to be incremented or decremented as a function of the sign of the difference E between signals fx and Pn. In the represented embodiment, the control circuit provides outputs SEL1, SEL2 ... SELn for selecting each cell C1, C2 ... Cn and values RET1 and RET2 which differ one with respect to the other by one unit. These values determine the delay of each cell, that is, the input number of the multiplexer Mi that has to be connected to its output Pi. A cell Ci will be controlled by signal RET1 or signal RET2 depending upon the value SELi applied thereto. Thus, the delays provided by each cell differ at most by one elementary delay d. The control circuit CTR includes logic means for causing signals RET1 and RET2 to change their state when all the signals SEL1-SELn have an identical value, that is, all the cells exhibit an identical delay.

Accordingly, starting from an initial state when all the cells are set at their minimum delay, the initial values of the pair RET1, RET2 will be (RET1,RET2)=(1,2). Then, when all signals SEL1 go to 1, the pair (RET1,RET2) goes to (2,3); then, when all signals SELi are at 0, the pair (RET1, RET2) goes to (3,4), and so on until (m-1,m) if it is needed to obtain the maximum delay. It should be noted that, when signals SELi are caused to go from 0 to 1, or from 1 to 0, the changes must be carried out in a balanced manner so that the cell Ci generates a signal Pi having a phase as close as possible to $(2+i/n)\pi$. To achieve this purpose, the delays of cells C1-Cn should not change sequentially over time. One of the best variation mode consists in sequentially selecting the following signals (in the case when n is a power of 2): SEL1, SELn/2, SELn/4, SEL3n/4, SELn/8, SEL5n/8, SEL3n/8, SEL7n/8 ...

Frequency range and jitter

The jitter inherent in the delay line is d since it has been seen that Pn was subject to a jitter ±d with respect to fx. The current existing CMOS technologies provide delay elements d whose delay time is usually 0.5–1 nanosecond, which allows for a tolerable jitter for a wide range of applications.

The frequency range of the delay line depends upon the number n of cells Ci, upon the number m of delay elements dj for each cell and upon the technology that is used. Considering that in a conventional MOS process in which an elementary delay d is desired, this delay can in fact vary between d/2 (best case) and 2d (worst case). Therefore, the total delay of the delay line can vary between $n*d/2$ and $m*n*d/2$ in the best case and between $n*2d$ and $m*n*2d$ in the worst case. To allow the phase generator to lock in all cases, the total delay of the delay line must be comprised within $2n*d$ and $n*m*d/2$.

Since the period fx of utilization is thus limited, the frequency range with the minimum frequency of $fmin=2/m*n*d$ and the maximum frequency of $fmax=1/n*2d$ results.

By way of example, in a case where m=8, n=16, d=0.8 ns, one obtains fmin=19.5 MHz, fmax=39 MHz, the jitter being equal to d=0.8 ns.

If the phase generator is used in a digital VCO architecture, the jitter inherent in VCOs is 1/n times the crystal frequency, that is, 1/nfx. Since a priori no time relation exists between the correction of the phase generator (having a jitter d), and the jitter inherent in the PLL, the total jitter, J, is:

$$J=[(1/nfx)^2+d^2]^{\frac{1}{2}},$$

whereby, in the above example:

$$2.12<J<2.62 \text{ ns.}$$

Exemplary embodiment

Figure 9:
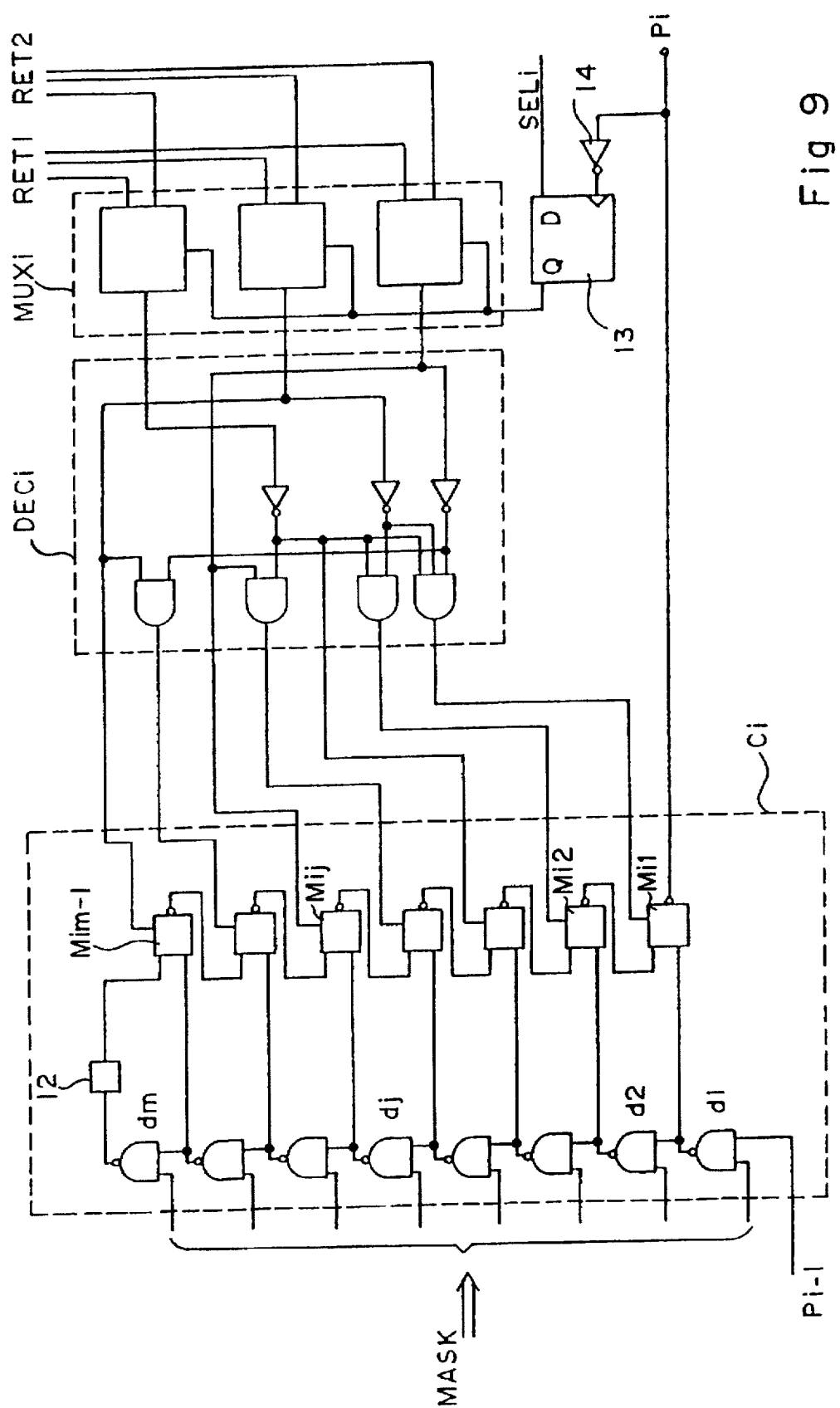
FIG. 9 represents an embodiment of a cell of a digital delay line according to the invention.

FIG. 9 represents only by way of example an embodiment of a cell such as the one of FIG. 6, associated with a control circuit such as the one of FIG. 8. Each delay element dj includes an NAND gate and one considers the specific case when the number of delay elements is m=8. The first input of each NAND gate is connected to the output of the NAND gate of lower rank, the gate d1 receiving signal Pi-1. The output of each NAND gate is also provided to the first input of a two-way multiplexer $M_{ij}$ whose second input receives the output of the multiplexer of higher rank, except the last multiplexer $M_{im-1}$ which receives the output of the NAND gate dm. In fact, considering the delay of each delay element, the transition in the corresponding multiplexer must be taken in account. Thus, after the NAND gate dm, a delay element is added.

Each multiplexer $M_{i1}$ to $M_{im-1}$ receives control signals from a decoding circuit DECi controlled by a plurality of multiplexers MUXi that receive signals RET1, RET2 and SELi from a control circuit such as the circuit CTR of FIG. 8. A specific exemplary embodiment of blocks MUXi et DECi is illustrated in the drawing where conventional symbols represent multiplexers, inverters and AND gates. This specific embodiment will not be described in detail because many alternative approaches are possible. The object of these circuits is to provide control signals to the multiplexers Mij so as to set in a first state multiplexers $M_{i1}$ to $M_{ik}$ and in a second state multiplexers $M_{ik}$ to $M_{im-1}$ in relation to the value of signal RET1 or RET2.

Each NAND gate d1-dm receives at its second input a signal corresponding to a conductor of a bus MASK. The signals of this bus MASK can be used for testing the operation of the circuit by imposing selected signals to the output of each NAND gate. Preferably, the bus MASK will be used during the operation of cell Ci to inhibit the NAND gates of this cell that are not used. This allows to minimize the power consumption.

Moreover, the use of NAND gates constituting series inverting cells makes it possible to balance the delays on the rising edge and the falling edge. The duty cycle of signal Pi will thus be little affected by its passage through cell Ci. In addition, the rank change of multiplexer Mi including elementary two-input multiplexer $M_{i1}$ to $M_{im-1}$ is carried out without undetermined switching since the transition from multiplexer $M_{ij}$ to multiplexer $M_{ij+1}$ requires only one transition on the control signal of this multiplexer.

Glitches

It should be noted that the device according to the invention uses many multiplexing circuits. One of the problems resulting from the use of a multiplexer is correlated with the switching time which must be such that no glitch occurs at the output.

Figure 10:
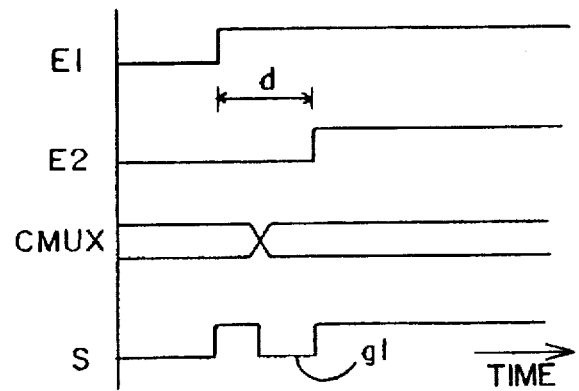
FIG. 10 represents signals liable to occur while the multiplexer is being controlled.

As shown in FIG. 10, in a multiplexer with two inputs E1 and E2, whose rising edges are for example spaced by value d, if a control signal CMUX of the multiplexer, which tends to switch the outputs between the rising edges of inputs E1 and E2, is applied, a parasitic negative pulse or glitch GL will appear on the output signal S. In the above described multiplexer Mi, the delay between two inputs is d. If the multiplexer control is synchronized with input 1 and if the control is delayed by at least value d with respect to this input 1, no glitch will occur. That is why, as represented in FIG. 9, a D-type flip-flop 13 is used for the synchronization of signal SELi. The delay of flip-flop 13, of multiplexer MUXi and of decoder DECi is selected higher than d. Since the signals (RET1, RET2, SELi) generated by the control block are synchronized with frequency fx, the synchronization flip-flop of signal SELi may exhibit metastable states. To avoid this drawback, the rising edge of Pi is used for cells having a high phase up to Cn and the falling edge of Pi is used for cells having a low phase (from C1). Thus, for the low phase cells, it is provided to insert an inverter 14 between the output of signal Pi and the synchronization input of flip-flop 13.

Figure 11:
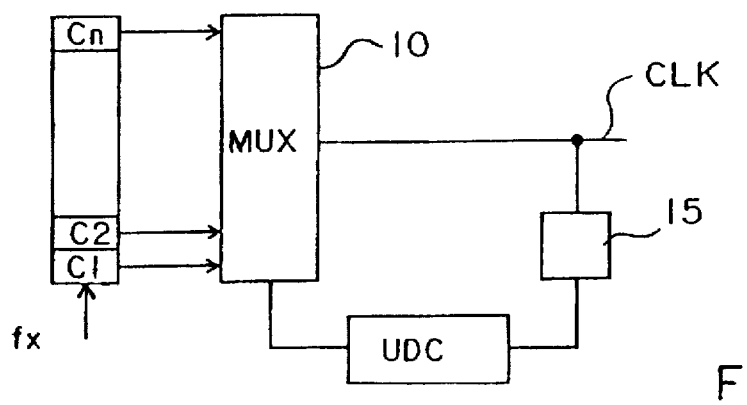
FIG. 11 represents a timing circuit associated with the control of a multiplexer.

In the application of the present invention to a digital VCO, the problem of the glitch inherent in the multiplexing is still present. Thus, FIG. 11 illustrates a method for synchronizing the multiplexer 10. The control of multiplexer 10 through an up/down counter UDC is synchronized with the output CLK of this multiplexer and is delayed by a delay equal to that of a cell Ci imposed by a delay circuit 15.

As is apparent to those skilled in the art, the digital balanced delay line according to the invention is liable of various applications. As indicated above, the digital delay line can be used for the realization of a VCO for use in a PLL, for example in a video PLL in which frequency fx is 32 MHz and in which the jitter is shorter than 5 nanoseconds. The digital delay line can also be used to compensate for the delay of signals caused by the line problems existing in printed circuits. The digital delay line can also be used to determine, and therefore to recover, the phase of some asynchronous or desynchronized signals in the field of telecommunications.

Having thus described one particular embodiment of the invention, various alterations, modifications, and improvements will readily occur to those skilled in the art. Such alterations, modifications, and improvements are intended to be part of this disclosure, and are intended to be within the spirit and scope of the invention. Accordingly, the foregoing description is by way of example only and is not intended to be limiting. The invention is limited only as defined in the following claims and the equivalents thereto.

What is claimed is:

1. A digital delay line to supply from a periodic input signal n signals with the same period mutually phase-shifted by one n-th of the input signal period, including:

n identical cells coupled in a series, a first cell in the series receiving the periodic input signal and each cell in the series providing a respective one of the n signals, each cell including m identical delay elements coupled in series to a multiplexer, a first delay element in the series forming an input of a respective cell, each output of a delay element being connected to an input of the multiplexer, and each multiplexer having an output that provides the respective one of the n signals;

means for comparing an output phase of the n-th cell with a phase of the periodic input signal to provide an error signal; and means for individually modifying the output of the multiplexer of one of the n cells in response to the error signal.

2. A delay line that receives an input clock signal, having a period, to provide n output signals, the delay line comprising:

an input terminal that receives the input clock signal;

n output terminals;

n cells, electrically coupled in a series to the input terminal, each cell of the n cells being coupled to a respective one of the n output terminals and providing a respective output signal of the n output signals, each cell including a plurality of identical delay elements coupled in a series, and each cell receiving a respective cell input signal and shifting a phase of the respective cell input signal to generate the respective output signal, a first cell in the series receiving the input clock signal as the respective cell input signal; and a control circuit coupled to each of the n cells that individually adjusts an amount of phase by which the respective cell input signal of at least one of the n cells is shifted, by providing control signals, to each cell, that select a respective number of the plurality of identical delay elements that the respective cell input signal propagates through, so that the phase shift through each of the at least one of the n cells is substantially the period of the input clock signal divided by n.

3. The delay line according to claim 2, wherein the control circuit coupled to each of the n cells individually adjusts the amount of phase by which the respective cell input signal of all of the n cells are shifted so that the phase shift through all of the n cells is substantially the period of the input clock signal divided by n.

4. The delay line according to claim 2, wherein each cell aside from the first cell receives the respective output signal of a prior cell in the series as the respective cell input signal.

5. The delay line according to claim 2, wherein each cell of the n cells comprises:

a series of m digital delay elements, each digital delay element providing a delayed output signal, a first digital delay element of the series receiving the respective cell input signal of the cell, and each digital delay element, aside from the first digital delay element, receiving the delayed output signal of a prior digital delay element in the series; and a multiplexing unit coupled to each one of the m digital delay elements and the control circuit, the delayed output signal of the m digital delay elements being received as inputs by the multiplexing unit, the control circuit selecting one delayed output signal from the inputs to be an output of the multiplexing unit, the output of the multiplexing unit being the respective output signal of the cell.

6. The delay line according to claim 2, wherein the input terminal, the n output terminals, the n cells, and the control circuit are implemented digitally.

7. A system for generating a variable frequency clock signal in response to a control signal, the system comprising:

a delay line that receives an input clock signal having a period and that provides n signals, the delay line including n cells, each cell providing a respective one of the n signals, and a control circuit coupled to each of the n cells that individually adjusts a phase by which each one of the n signals is shifted so that each of the n signals has a respective phase shift from the input clock signal and is successively phase shifted from another of the n signals by substantially the period of the input clock signal divided by n;

an output clock terminal that provides the variable frequency clock signal;

a control terminal that receives the control signal; and a voltage controlled oscillator, coupled between the delay line and the output clock terminal and to the control terminal, that receives the n signals and the control signal to generate the variable frequency clock signal, the control signal selecting one of the n signals to be the variable frequency clock signal.

8. The system according to claim 7, wherein the voltage controlled oscillator comprises:

a multiplexer having n input terminals coupled to the delay line, and having a select line and an output terminal coupled to the output clock terminal, each one of the n signals of the delay line being an input on a respective one of the n input terminals;

an up-down counter coupled to the control terminal and the select line of the multiplexer, the up-down counter selecting, based on the control signal on the control terminal, one of the n signals as an output at the output terminal of the multiplexer; and a bit rate multiplier coupled to the control terminal and the up-down counter that receives the control signal on the control terminal to generate a counter clock signal that determines a rate of counting in the up-down counter.

9. The system according to claim 7, wherein the delay line is implemented digitally.

10. The system according to claim 8, further comprising:

a delay unit, coupled between the output clock terminal and the up-down counter, that provides a delay before a transition in the up-down counter such that all of the n signals at the n input terminals of the multiplexer have settled to a final state before a transition of the up-down counter selects a new one of the n signals to be the variable frequency clock signal.

11. A method of generating n signals given an input clock signal having a period, the method including the steps of:

A. receiving the input clock signal;

B. phase-shifting the input clock signal to generate n signals, each one of the n signals having a respective phase shift;

C. forming an error signal, the error signal indicating whether each of the n signals are successively phase shifted from each other by substantially the period of the input clock signal divided by n; and D. individually, for each of the n signals, adjusting a respective number of digital delay elements that each signal propagates through to set the respective phase shift, based on the error signal, so that each of the n signals are successively phase-shifted from each other by substantially the period of the input clock signal divided by n.

12. The method of generating n signals according to claim 11, further including the step of:

E. repeating steps C–D until each of the n signals are successively phase-shifted from each other by substantially the period of the input clock signal divided by n.

13. The method of generating n signals according to claim 11, wherein step C includes:

comparing a phase of a signal of the n signals, that has a most phase shift from the input clock signal, with a phase of the input clock signal to form the error signal.

14. The method of generating n signals given an input clock signal, according to claim 11, wherein step D includes a step of:

selecting the respective number of digital delay elements that each signal propagates through so that each of the n signals are successively phase-shifted from each other by substantially the period of the input clock signal divided by n.

15. A delay line that receives an input clock signal having a period to provide n signals, each one of the n signals having a respective phase shift from the input clock signal, the delay line comprising:

an input terminal that receives the input clock signal;

a series of n output terminals, each output terminal providing a respective one of the n signals;

n cells coupled in a series to the input terminal and each one of the n cells coupled to a respective one of the n output terminals, a first cell in the series receiving the input clock signal; and means for maintaining a phase shift of a first signal of the n signals from a second signal of the n signals substantially at the period of the input clock signal divided by n, by individually adjusting a respective number of digital delay elements in each of the n cells through which each of the n signals propagate, for each of the n cells.

16. The delay line according to claim 15, wherein the first signal is on a first terminal of the series of n output terminals and the second signal is on a next terminal adjacent to the first terminal in the series.

17. The delay line according to claim 15, further comprising:

means for implementing the delay line digitally.

18. The delay line of claim 1, wherein each multiplexer is formed by m-1 two-input multiplexers of different rank, a two-input multiplexer with a highest rank receiving the outputs of the last two delay elements in series, and each respective two-input multiplexer of lower rank receiving the output of a two-input multiplexer having an immediately higher rank and the output of a delay element having a rank lower than the delay element processed by the two-input multiplexer of immediately higher rank.

19. The delay line of claim 1, wherein each delay element is formed by a NAND gate having a first input that receives a signal to be delayed and a second input that receives an enabling signal.

20. The delay line of claim 1, further comprising a second multiplexer, having n input terminals that each receive a respective one of the n signals.

21. The delay line of claim 2, further comprising a multiplexer having n input terminals that each receive a respective one of the n output signals.

* * * * *

UNITED STATES PATENT AND TRADEMARK OFFICE
CERTIFICATE OF CORRECTION

PATENT NO. : 5,719,515
DATED : February 17, 1998
INVENTOR(S) : Jean-Luc Danger

It is certified that error appears in the above-identified patent and that said Letters Patent is hereby corrected as shown below:

On the title page, item [73] should read:

[73] Assignees: SGS-Thomson Microelectronics S.A., Gentilly, France and NOKIA Technology GmbH, Pforzheim, Germany Signed and Sealed this Fourteenth Day of March, 2000

Attest:

Q. TODD DICKINSON

Attesting Officer

Commissioner of Patents and Trademarks